United States Patent
Konishi et al.

(10) Patent No.: US 8,604,506 B2
(45) Date of Patent: Dec. 10, 2013

(54) SURFACE MOUNTING TYPE LIGHT EMITTING DIODE AND METHOD FOR MANUFACTURING THE SAME

(75) Inventors: Masahiro Konishi, Ikoma (JP); Toshio Hata, Mihara (JP); Taiji Morimoto, Onomichi (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 1016 days.

(21) Appl. No.: 12/035,216

(22) Filed: Feb. 21, 2008

(65) Prior Publication Data

US 2008/0203416 A1  Aug. 28, 2008

(30) Foreign Application Priority Data

Feb. 22, 2007 (JP) ................. 2007-042642
Dec. 28, 2007 (JP) ................. 2007-339975

(51) Int. Cl.
*H01L 33/00* (2010.01)
(52) U.S. Cl.
USPC .................. 257/99; 257/96; 257/E51.018
(58) Field of Classification Search
USPC .......... 257/96, 97, 98, 99, 100, 101, 102, 103, 257/E51.018, E51.022, E33.001, E33.007, 257/E33.057, E25.028, E25.032, E33.056, 257/E33.058, E33.06, E33.072, E33.073, 257/104, E33.73; 438/22, 46, 47
See application file for complete search history.

(56) References Cited

U.S. PATENT DOCUMENTS

| | | | |
|---|---|---|---|
| 4,742,432 A | 5/1988 | Thillays et al. | |
| 4,907,044 A | 3/1990 | Schellhorn et al. | |
| 6,198,901 B1 | 3/2001 | Watanabe | |
| 6,301,035 B1 | 10/2001 | Schairer | |
| 6,495,861 B1 | 12/2002 | Ishinaga | |
| 6,707,069 B2 | 3/2004 | Song et al. | |
| 6,747,293 B2 | 6/2004 | Nitta et al. | |
| 6,770,498 B2 * | 8/2004 | Hsu ............................. | 438/26 |

(Continued)

FOREIGN PATENT DOCUMENTS

| | | |
|---|---|---|
| CN | 85104012 | 9/1986 |
| CN | 2544416 | 4/2003 |

(Continued)

OTHER PUBLICATIONS

U.S Office Action mailed on Dec. 12, 2008, directed towards related U.S. Appl. No. 11/400,664; 13 pages.

(Continued)

*Primary Examiner* — Cuong Q Nguyen
*Assistant Examiner* — Yosef Gebreyesus
(74) *Attorney, Agent, or Firm* — Morrison & Foerster LLP

(57) ABSTRACT

This invention provides a surface mounting type light emitting diode excellent in heat radiation performance, reliability and productivity. The surface mounting type light emitting diode includes a metallic base member, a semiconductor light emitting element having a bottom face fixedly bonded to a top face of the base member, and a metallic reflector joined to the top face of the base member with a heat conduction type adhesive sheet interposed therebetween, to surround the semiconductor light emitting element. Heat generated from the semiconductor light emitting element is transferred to the reflector via the base member and the heat conduction type adhesive sheet, and then is radiated to the outside. The metallic reflector can efficiently radiate the heat to the outside. The cutting margin provided for the reflector facilitates a dicing process, which improves productivity.

16 Claims, 9 Drawing Sheets

(56) References Cited

U.S. PATENT DOCUMENTS

| | | |
|---|---|---|
| 6,909,123 B2 | 6/2005 | Hayashimoto et al. |
| 2002/0080622 A1 | 6/2002 | Pashley et al. |
| 2002/0190262 A1 | 12/2002 | Nitta et al. |
| 2003/0022407 A1 | 1/2003 | Sakamoto et al. |
| 2004/0056265 A1 | 3/2004 | Arndt et al. |
| 2004/0065894 A1 | 4/2004 | Hashimoto et al. |
| 2004/0075100 A1* | 4/2004 | Bogner et al. .............. 257/99 |
| 2004/0129945 A1 | 7/2004 | Uemura |
| 2004/0201987 A1 | 10/2004 | Omata |
| 2004/0211970 A1 | 10/2004 | Hayashimoto et al. |
| 2004/0256630 A1 | 12/2004 | Cao |
| 2005/0051782 A1 | 3/2005 | Negley et al. |
| 2005/0133939 A1 | 6/2005 | Chikugawa et al. |
| 2006/0145343 A1 | 7/2006 | Lee et al. |
| 2006/0157722 A1* | 7/2006 | Takezawa et al. .............. 257/98 |
| 2006/0226437 A1* | 10/2006 | Fujita et al. .............. 257/98 |
| 2006/0244127 A1 | 11/2006 | Holalkere et al. |
| 2006/0267036 A1* | 11/2006 | Lee et al. .............. 257/98 |
| 2006/0267042 A1* | 11/2006 | Izuno et al. .............. 257/100 |
| 2007/0007558 A1* | 1/2007 | Mazzochette .............. 257/239 |
| 2007/0108464 A1* | 5/2007 | Seol .............. 257/100 |
| 2008/0012036 A1 | 1/2008 | Loh et al. |
| 2008/0121921 A1* | 5/2008 | Loh et al. .............. 257/99 |
| 2008/0191620 A1* | 8/2008 | Moriyama et al. .............. 313/506 |
| 2008/0197274 A1 | 8/2008 | Harder |
| 2008/0203417 A1 | 8/2008 | Konishi et al. |
| 2009/0315059 A1 | 12/2009 | Fujita et al. |

FOREIGN PATENT DOCUMENTS

| | | |
|---|---|---|
| CN | 1466782 A | 1/2004 |
| CN | 1538538 | 10/2004 |
| CN | 2655428 | 11/2004 |
| JP | 51-124388 | 10/1976 |
| JP | 59-207674 | 11/1984 |
| JP | 6-77540 | 3/1994 |
| JP | 11-40859 | 2/1999 |
| JP | 11-046018 | 2/1999 |
| JP | 11-087780 | 3/1999 |
| JP | 2000-058924 A | 2/2000 |
| JP | 2000-077725 | 3/2000 |
| JP | 2000-216443 | 8/2000 |
| JP | 2000-269551 | 9/2000 |
| JP | 2000-294838 | 10/2000 |
| JP | 2002-222998 | 8/2002 |
| JP | 2003-197974 | 7/2003 |
| JP | 2004-111909 | 4/2004 |
| JP | 2004-516666 | 6/2004 |
| JP | 2004-193357 | 7/2004 |
| JP | 2004-311917 | 11/2004 |
| JP | 2004-327863 | 11/2004 |
| JP | 2004-327955 | 11/2004 |
| JP | 2005-39100 | 2/2005 |
| JP | 2005-175389 | 6/2005 |
| JP | 2005-183531 | 7/2005 |
| JP | 2006-165138 | 6/2006 |
| JP | 2006-186297 | 7/2006 |
| JP | 2006-294804 | 10/2006 |
| JP | 2006-324589 | 11/2006 |
| KR | 2002-0079516 | 10/2002 |
| KR | 10-2004-0092512 | 11/2004 |
| WO | WO-02/05351 A1 | 1/2002 |

OTHER PUBLICATIONS

Chinese Office Action mailed Dec. 11, 2009, directed to counterpart Chinese Application No. 200810074060.2; 10 pages.

Extended European Search Report mailed on Aug. 14, 2006 directed to related European Patent Application No. 06007421.8; 4 pages.

Chinese Office Action dated Jun. 8, 2007, directed to related CN Application No. 200610073239.7; 20 pages.

Chinese Office Action dated Oct. 30, 2009, directed to related Chinese Application No. 2008100740710; 14 pages.

Konishi et al., U.S. Office Action mailed Jan. 13, 2010, directed to related U.S. Appl. No. 12/035,320; 13 pages.

Fujita et al., U.S. Office Action mailed May 4, 2010, directed towards U.S. Appl. No. 12/548,112; 9 pages.

U.S. Office Action, mailed Jun. 11, 2008, directed to related U.S. Appl. No. 11/400,664. 9 pages.

Konishi, M. et al., U.S. Office Action mailed Jun. 10, 2010, directed to U.S. Appl. No. 12/035,320; 16 pages.

Fujita et al.; U.S. Office Action mailed Oct. 18, 2010, directed to U.S. Appl. No. 12/548,112; 10 pages.

Accuratus Ceramic Corporation. "94% Alumina Material Properties," located at <www.accuratus.com/pdf/94aluminaprops.pdf> visited on Oct. 17, 2012. (1 page).

Konishi et al., U.S. Office Action mailed Jul. 18, 2012, directed to U.S. Appl. No. 12/035,320; 11 pages.

Japanese Decision for Dismissal of Amendment, mailed Jan. 5, 2011, directed to Japanese Patent Application No. 2005-112292; 5 pages.

Notice of Grounds of Rejection mailed Feb. 14, 2012, directed to Japanese Application No. 2007-339975; 9 pages.

* cited by examiner

SURFACE MOUNTING TYPE LIGHT EMITTING DIODE AND METHOD FOR MANUFACTURING THE SAME

This nonprovisional application is based on Japanese Patent Application(s) No(s). 2007-042642 and 2007-339975 filed with the Japan Patent Office on Feb. 22, 2007 and Dec. 28, 2007, respectively, the entire contents of which are hereby incorporated by reference.

BACKGROUND OF THE INVENTION

1. Field of the Invention

The present invention relates to a surface mounting type light emitting diode. In particular, the present invention relates to a surface mounting type light emitting diode attaching importance to heat radiation performance, reliability and productivity, and to a method for manufacturing the same.

2. Description of the Background Art

A semiconductor light emitting element emits visible light or near infrared light in such a manner that a PN junction is formed on an AlInGaP compound semiconductor wafer or a GaN compound semiconductor wafer and forward electric current is fed to the PN junction. In recent years, the semiconductor light emitting element has been widely adopted for use in display, communication, measurement, control and the like. Further, the semiconductor light emitting element tends to be used in a field of automotive components requiring good heat radiation performance and high reliability. There has been also developed a surface mounting type light emitting diode for satisfying such requirements.

As shown in FIG. 16, a conventional surface mounting type light emitting diode 100 has the following structure. That is, a semiconductor light emitting element 103 is mounted on a substrate 101 having electrodes 102. Semiconductor light emitting element 103 has electrodes connected to electrodes 102 of substrate 101 through electric conductive wires 104 by a wire bonding process. Substrate 101 includes a molding member 105.

When a semiconductor light emitting element (an LED chip) mounted on a surface mounting type light emitting diode emits light, heat is generated from the LED chip. As electric current to be fed to the LED chip is large in amount, the heat generated from the LED chip becomes large in amount. In such an LED chip, typically, as a temperature increases, light emission efficiency deteriorates and degradation of emitted light becomes noticeable. In other words, even when a large amount of electric current is fed to the LED chip, intensity of light emitted from the LED chip is not improved effectively, and a lifetime of the LED chip shortens disadvantageously. In order to avoid such disadvantages, the heat generated from the LED chip is effectively radiated to the outside so as to decrease the temperature of the LED chip. Thus, the LED chip can ensure good light emission efficiency and good lifetime characteristic even when a large amount of electric current is fed thereto.

Examples of the foregoing conventional semiconductor light emitting device with improved heat radiation effect are disclosed in Japanese Patent Laying-Open Nos. 11-046018, 2002-222998, 2000-058924, 2000-077725, 2000-216443 and the like. In Japanese Patent Laying-Open Nos. 11-046018 and 2002-222998, the heat radiation performance can be improved in such a manner that a surface area of a lead frame is enlarged. In Japanese Patent Laying-Open Nos. 2000-058924, 2000-077725 and 2000-216443, on the other hand, the heat radiation performance can be improved in such a manner that a substrate is made of metal superior in heat conductivity to resin.

In conventional surface mounting type light emitting diode 100 shown in FIG. 16, however, the heat generated from semiconductor light emitting element 103 is received only by electrodes 102. Consequently, the heat radiation performance of conventional surface mounting type light emitting diode 100 is unsatisfactory. In addition, the reliability of conventional surface mounting type light emitting diode 100 is also unsatisfactory in a case where conventional surface mounting type light emitting diode 100 is used as an automotive component in severe environment-resistant conditions (e.g., temperature, vibration). In order to arrange a fluorescent material (a fluorescent substance) in a reflector for reflecting light emitted from semiconductor light emitting element 103, molding member 105 for covering semiconductor light emitting element 103 must contain such a fluorescent material. However, a resin containing the fluorescent material is degraded by exposure to high-temperature heat generated from semiconductor light emitting element 103, in the vicinity of semiconductor light emitting element 103. Consequently, the lifetime of conventional surface mounting type light emitting diode 100 serving as a light source shortens disadvantageously.

SUMMARY OF THE INVENTION

A principal object of the present invention is to provide a surface mounting type light emitting diode excellent in heat radiation performance, reliability and productivity, and a method for manufacturing the same.

The surface mounting type light emitting diode according to the present invention includes: a metallic base member; a semiconductor light emitting element having a bottom face fixedly bonded to a top face of the base member; and a metallic reflector joined to the top face of the base member with an insulating adhesive sheet interposed therebetween, so as to surround the semiconductor light emitting element.

In this case, heat generated from the semiconductor light emitting element is transferred to the reflector via the base member and the adhesive sheet, and then is radiated from the reflector to the outside. In addition, the heat is partially radiated to the outside via the base member. The metallic base member and the metallic reflector can efficiently radiate the heat generated from the semiconductor light emitting element to the outside. In addition, the metallic base member and the metallic reflector can efficiently release light emitted from the semiconductor light emitting element to the outside. Each of the base member and the reflector may be made of a combination of different kinds of metal. For example, each of the base member and the reflector may have a configuration that on a surface of a metal material, different metal is laminated by a plating process. More preferably, each of the base member and the reflector is made of a single material, which facilitates manufacturing of each of the base member and the reflector and improves productivity. If each of the base member and the reflector is made of the single material, this single material may be not only one kind of metal, but also an alloy.

Desirably, the reflector has a projection formed at an outer peripheral face thereof, and the projection has a width smaller than a width of the outer peripheral face. The reflector is made of metal. Therefore, if the reflector has a large thickness, a dicing process is hard to be performed on the reflector. Upon formation of the reflector from a plate material, a region which is thinner in thickness than the plate material is provided as a cutting margin. This region facilitates the dicing process, which improves productivity without reducing yield of a surface mounting type light emitting diode. A shape of the diced cutting margin corresponds to the projection. The projection increases a surface area of the reflector, which achieves more efficient heat radiation.

Moreover, the reflector may have a plurality of projections each equal to the foregoing projection at the outer peripheral face thereof. In this case, the heat radiation from the reflector to the outside is accelerated, which further improves heat radiation performance.

Desirably, the base member is made of at least any one of Al, Cu, Fe and Mg, or a complex thereof. These materials are high in heat conductivity. Therefore, the base member made of one of these materials can efficiently radiate heat generated from the semiconductor light emitting element to the outside. In addition, since these materials are readily subjected to processing, the base member can be fabricated readily.

Desirably, the reflector is made of at least any one of Al, Cu, Fe and Mg, or a complex thereof. These materials are high in heat conductivity. Therefore, the reflector made of one of these materials can efficiently radiate heat generated from the semiconductor light emitting element to the outside. In addition, since these materials are readily subjected to processing, the reflector can be fabricated readily.

Desirably, the surface mounting type light emitting diode according to the present invention further includes a plurality of semiconductor light emitting elements each equal to the foregoing semiconductor light emitting element. In this case, a high power light source can be realized. If a blue LED chip, a green LED chip and a red LED chip are mounted as the plurality of semiconductor light emitting elements, a light source to be realized can perform toning of white light by adjustment of an amount of electric current to be fed to each LED chip. Herein, a plurality of blue LED chips, a plurality of green LED chips and a plurality of red LED chips may be mounted as the plurality of semiconductor light emitting elements.

Desirably, the base member includes an insulating member for electrically insulating a portion, to which the semiconductor light emitting element is fixedly bonded, in the base member from a portion, to which the reflector is joined, in the base member. In this case, the semiconductor light emitting element is electrically insulated from the portion, to which the reflector is joined, in the base member. Therefore, when an electrode of the semiconductor light emitting element is electrically connected to a portion, to which the reflector is joined, of the metallic base member, electric current can be fed to the semiconductor light emitting element. That is, when the semiconductor light emitting element is electrically connected to the portion, to which the reflector is joined, of the base member, a circuit for allowing the surface mounting type light emitting diode to emit light can be formed.

Desirably, the adhesive sheet is made of at least any one of a heat conductive silicone, a heat conductive acryl and a heat conductive epoxy, or a complex (a multilayered body) thereof obtained by laminating these materials. These materials are high in heat conductivity (e.g., 1.0 W/m·K or more), which allows efficient radiation of heat generated from the semiconductor light emitting element and then radiated to the translucent resin. Herein, the heat conduction type adhesive sheet is filled with a heat conductive filler, and examples of the heat conductive filler may include a silicon oxide, an aluminum oxide, a magnesium oxide, an aluminum hydroxide and the like each having a good heat conductivity. As the heat conduction type adhesive sheet, alternatively, it may be considered that a heat conduction type viscous material, an aluminum foil and a heat conduction type viscous material are laminated in this order to form a sheet or a heat conduction type viscous material, a heat conductive compound and a heat conduction type viscous material are laminated in this order to form a sheet.

Desirably, the reflector has an inner circumferential face formed into a part of any one of a conical face, a spherical face and a paraboloidal face. In this case, light emitted from the semiconductor light emitting element can be released efficiently.

Desirably, at least the top face of the base member, to which the semiconductor light emitting element is fixedly bonded, is subjected to gold plating or silver plating. In this case, a bonding process for fixedly bonding the semiconductor light emitting element to the base member becomes favorable. In addition, the silver plating brings a high light reflectivity, which improves efficiency for releasing light emitted from the semiconductor light emitting element toward the base member.

Desirably, the top face of the base member is subjected to gold plating or silver plating to form a conductor layer electrically connected to the semiconductor light emitting element. In this case, the conductor layer can be prevented from being altered.

Desirably, the surface mounting type light emitting diode according to the present invention further includes a translucent resin provided on the base member so as to cover the semiconductor light emitting element and to come into no contact with the reflector. In this case, the translucent resin covers the semiconductor light emitting element to prevent circuitry from being exposed to outside air, and comes into no contact with the reflector. This configuration eliminates occurrence of a problem that heat transferred from the semiconductor light emitting element to the translucent resin causes expansion and shrinkage of the translucent resin so that the translucent resin is separated from the reflector. This configuration also eliminates occurrence of a problem that the translucent resin is separated from the reflector due to expansion and shrinkage of the base member, which reduces a possibility of failure of the surface mounting type light emitting diode and improves reliability. Herein, the material for the base member may be different in coefficient of thermal expansion from the material for the reflector.

Desirably, the translucent resin contains a fluorescent material excited by light released from the semiconductor light emitting element to emit light longer in wavelength than the light released from the semiconductor light emitting element. For example, the semiconductor light emitting element is a blue semiconductor light emitting element made of a gallium nitride-based compound semiconductor. Desirably, the translucent resin contains a fluorescent material excited by light released from the blue semiconductor light emitting element to emit yellow light. This configuration allows provision of a white light source. Herein, the semiconductor light emitting element may be made of a ZnO (zinc oxide)-based compound semiconductor. Further, the semiconductor light emitting element may be configured to emit near UV light.

The reflector may have an irregular bonding face to the base member. Alternatively, the reflector may have a sawtoothed bonding face to the base member. In this case, heat conduction from the adhesive sheet to the reflector is improved. Accordingly, heat generated from the semiconductor light emitting element can be efficiently radiated to the outside. Moreover, a joining strength of the reflector can be enhanced.

The method for manufacturing the surface mounting type light emitting diode according to the present invention includes the steps of: successively laminating an insulating layer and a conductor layer on a part of a surface of a metallic base member aggregate; forming a plurality of through holes and a plurality of trenches for cutting, on a metallic reflector workpiece; joining the reflector workpiece onto the base member aggregate with a heat conduction type adhesive sheet interposed therebetween; fixedly bonding a plurality of semiconductor light emitting elements onto the base member aggregate at positions inside the plurality of through holes; electrically connecting between each of the semiconductor light emitting elements and the conductor layer; and dicing the reflector workpiece and the base member aggregate along the trench to obtain a surface mounting type light emitting diode having a single base member and a single reflector.

In this case, the metallic base member and the metallic reflector can efficiently radiate heat generated from the semiconductor light emitting element to the outside. In addition, the metallic base member and the metallic reflector can efficiently release light emitted from the semiconductor light emitting element to the outside. If the metallic reflector has a large thickness, a dicing process is hard to be performed on the reflector. In order to eliminate this disadvantage, the trench for cutting is formed on the reflector workpiece. This trench facilitates the dicing process, which improves productivity without reducing yield of a surface mounting type light emitting diode.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
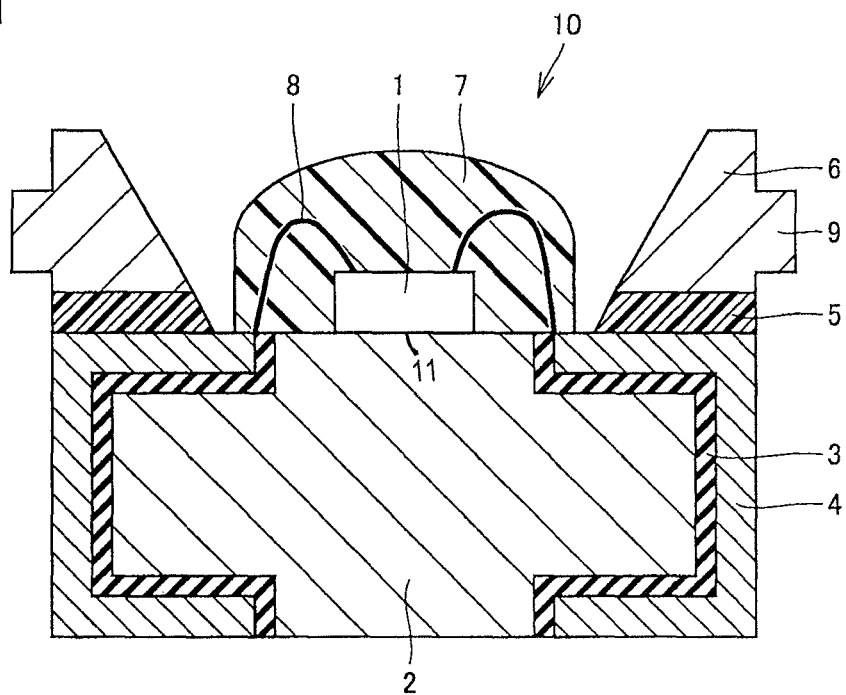
FIG. 1 schematically shows a part of a sectional structure of a surface mounting type light emitting diode according to a first embodiment of the present invention.

With reference to the drawings, hereinafter, description will be given of preferred embodiments of the present invention. In the respective drawings, identical or corresponding components are denoted by identical reference numerals; therefore, repetitive description thereof will not be given.

First Embodiment

As shown in FIG. 1, a surface mounting type light emitting diode 10 includes a semiconductor light emitting element 1, a base member 2, an insulating layer 3, a conductor layer 4, a heat conduction type adhesive sheet 5, a reflector 6 provided with a projection 9, a fluorescent material-containing translucent resin 7 and an electric conductive wire 8.

Base member 2 is made of aluminum (Al) having a good heat conductivity, and is formed into a plate shape. Semiconductor light emitting element 1 has a bottom face fixedly bonded to a top face of base member 2. Insulating layer 3 is laminated on a part of a surface of base member 2, and conductor layer 4 is laminated on a surface of insulating layer 3 to serve as a metal wiring pattern conductor. Heat conduction type adhesive sheet 5 having an insulating property is laminated on a part of conductor layer 4, and reflector 6 is provided on heat conduction type adhesive sheet 5. As shown in FIG. 1, in other words, reflector 6 is joined to the top face of base member 2 (i.e., the surface to which semiconductor light emitting element 1 is fixedly bonded) with heat conduction type adhesive sheet 5 interposed therebetween, so as to surround semiconductor light emitting element 1. Insulating layer 3 electrically insulates base member 2 having semiconductor light emitting element 1 fixedly bonded thereto from conductor layer 4 having reflector 6 joined thereto. Semiconductor light emitting element 1 has an electrode electrically connected to conductor layer 4 through electric conductive wire 8. Conductor layer 4 functions as an external connection terminal at a bottom face opposite to the top face to feed electric current to semiconductor light emitting element 1 from outside; thus, a circuit for allowing surface mounting type light emitting diode 10 to emit light can be formed.

Reflector 6 is made of aluminum (Al), and is formed into a bowl shape (a minimum inner diameter: approximately 2 mm, a maximum inner diameter: approximately 3 mm). Projection 9 provided on an outer peripheral face of reflector 6 is a residue of a cutting margin used for facilitation of a dicing process. Projection 9 has a width smaller than a width of the outer peripheral face of reflector 6. This width indicates a dimension in a direction perpendicular to the top face of base member 2 (i.e., the surface to which semiconductor light emitting element 1 is fixedly bonded). As shown in FIG. 1, more specifically, the dimension of projection 9 in a thickness direction of reflector 6 (a vertical direction in FIG. 1) is smaller than a thickness of reflector 6 in a cross section of reflector 6. Moreover, an inner circumferential wall of reflector 6 is subjected to a mirror finish. Since reflector 6 is formed into the bowl shape and the inner circumferential wall thereof is subjected to the mirror finish, light emitted from semiconductor light emitting element 1 is reflected by reflector 6, and then is efficiently released to the outside. The light from semiconductor light emitting element 1 is partially emitted toward base member 2. Since base member 2 is also made of metal, the light is reflected by the top face of base member 2, and then is efficiently released to the outside. That is, an amount of light to be leaked from the bottom face of base member 2 can be reduced considerably.

On the top face of base member 2, moreover, semiconductor light emitting element 1 is mounted at a position inward with respect to reflector 6. Semiconductor light emitting element 1 is covered with translucent resin 7 made of a silicone resin. Translucent resin 7 contains a fluorescent material excited by light from semiconductor light emitting element 1 to emit yellow light. The fluorescent material is dispersed in and held by translucent resin 7.

Semiconductor light emitting element 1 is a blue semiconductor light emitting element made of a gallium nitride-based compound semiconductor, and is formed into a chip shape having a P-electrode and an N-electrode provided on a single side (a top face in FIG. 1). Semiconductor light emitting element 1 emits blue light. Herein, yellow light obtained in such a manner that the fluorescent material dispersed in and held by translucent resin 7 absorbs the blue light is mixed with the blue light which is not absorbed by the fluorescent material, so that white light is obtained. When a plurality of semiconductor light emitting elements 1 are mounted, a higher power light source can be obtained. Herein, translucent resin 7 may be formed into a convex lens shape bulging toward a side spaced away from the surface of base member 2. Herein, the blue light is emitted at a peak wavelength in a range from 350 nm or more to 490 nm or less. The yellow light is emitted at a peak wavelength in a range from 550 nm or more to 650 nm or less. That is, the yellow light is longer in wavelength than the blue light.

Herein, translucent resin 7 and reflector 6 come into no contact with each other. This configuration eliminates occurrence of a problem that heat generated from semiconductor light emitting element 1 causes expansion and shrinkage of translucent resin 7 so that translucent resin 7 is separated from reflector 6, which reduces a possibility of failure of surface mounting type light emitting diode 10 and improves reliability. Herein, the material for base member 2 may be different in coefficient of thermal expansion from the material for reflector 6.

Figure 2:
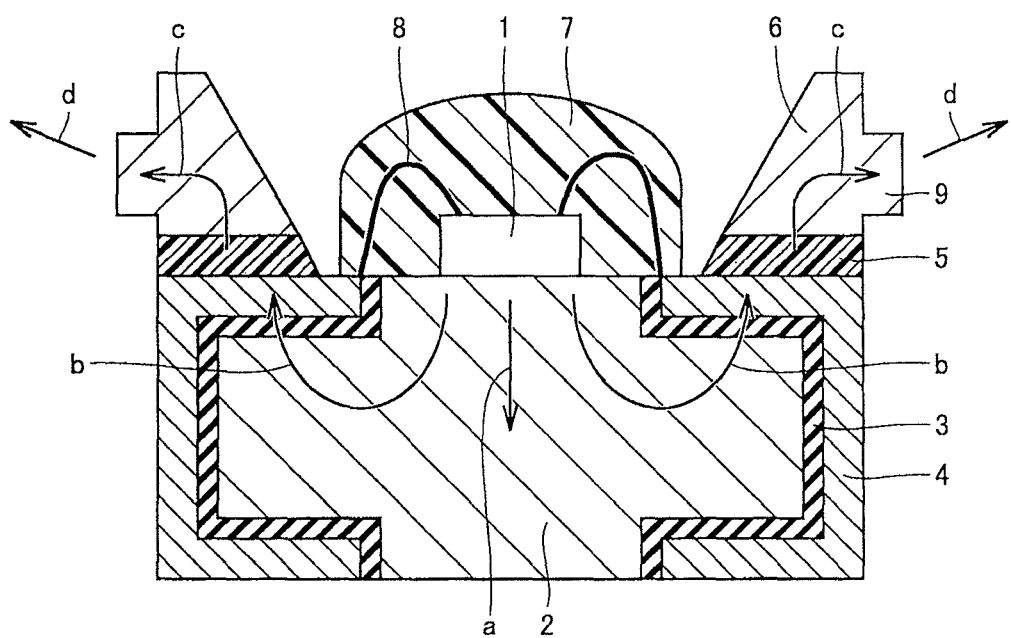
FIG. 2 schematically shows a conduction state of heat generated from a semiconductor light emitting element.

In FIG. 2, arrow marks "a", "b", "c" and "d" each denote a direction of heat conduction. As shown in FIG. 2, heat generated from semiconductor light emitting element 1 is transferred to base member 2 in the directions of arrow marks "a" and "b". The heat transferred to base member 2 is partially radiated to the outside via base member 2. The remaining heat is transferred to reflector 6 via heat conduction type adhesive sheet 5 in the directions of arrow marks "b" and "c". The heat transferred to reflector 6 is radiated to the outside in the direction of arrow mark "d".

Each of base member 2 and reflector 6 is made of Al, and has a high heat conductivity. Therefore, the heat generated from semiconductor light emitting element 1 can be efficiently radiated to the outside. Thus, surface mounting type light emitting diode 10 can exhibit excellent heat radiation performance. Projection 9 of reflector 6 increases a surface area of reflector 6, which achieves more efficient heat radiation. Moreover, since reflector 6 is joined to base member 2 with heat conduction type adhesive sheet 5 interposed therebetween, heat is readily transferred to reflector 6 made of Al. Thus, the heat generated from semiconductor light emitting element 1 can be efficiently radiated to the outside. It is needless to say that heat conduction type adhesive sheet 5 to be used herein is excellent in heat conductivity. For example, heat conduction type adhesive sheet 5 may be made of any one of a heat conductive silicone, a heat conductive acryl and a heat conductive epoxy, or a complex (a multilayered body) thereof obtained by laminating these materials.

Since the heat generated from semiconductor light emitting element 1 can be efficiently radiated to the outside, the temperature of semiconductor light emitting element 1 is lowered, so that the temperature of translucent resin 7 for covering semiconductor light emitting element 1 is kept to be low. Therefore, translucent resin 7 can be prevented from being degraded due to a disadvantage that the fluorescent material dispersed in and held by translucent resin 7 is exposed to the high temperature of semiconductor light emitting element 1. Thus, this configuration allows prolonging of a lifetime of surface mounting type light emitting diode 10. In addition, this configuration allows suppression of variation of colors generated by surface mounting type light emitting diode 10.

The fluorescent material dispersed in and held by translucent resin 7 is at least one of a YAG (Yttrium-Aluminum-Garnet)-based fluorescent material, a BOS (Barium Ortho-Silicate)-based fluorescent material and a TAG (Terbium-Aluminum-Garnet)-based fluorescent material each having gadolinium and cerium added thereto. In order to obtain white light, translucent resin 7 must contain a fluorescent material. However, it is needless to say that semiconductor light emitting element 1 may be sealed with only translucent resin 7 containing no fluorescent material in surface mounting type light emitting diode 10. Desirably, translucent resin 7 is at least one of a silicone-based resin, an epoxy-based resin, an acryl-based resin, a fluorine-based resin, a polyimide-based resin and a silicone-modified epoxy-based resin, or a complex thereof. The heat generated from semiconductor light emitting element 1 is partially radiated to the outside via translucent resin 7. Preferably, translucent resin 7 is excellent in heat radiation performance, for example, translucent resin 7 has a heat conductivity of 0.3 W/m·K or more.

The light emitted from semiconductor light emitting element 1 is efficiently released to the outside because reflector 6 is made of metal (Al). Since reflector 6 is made of Al, the inner circumferential face of reflector 6 may not be subjected to Al deposition or metal plating so as to increase a reflectivity as a reflection layer. Therefore, reflector 6 can be fabricated readily. Moreover, surface mounting type light emitting diode 10 is manufactured only in such a manner that base member 2 and reflector 6 are bonded to each other through heat conduction type adhesive sheet 5. Therefore, surface mounting type light emitting diode 10 can be manufactured readily.

Figure 3:
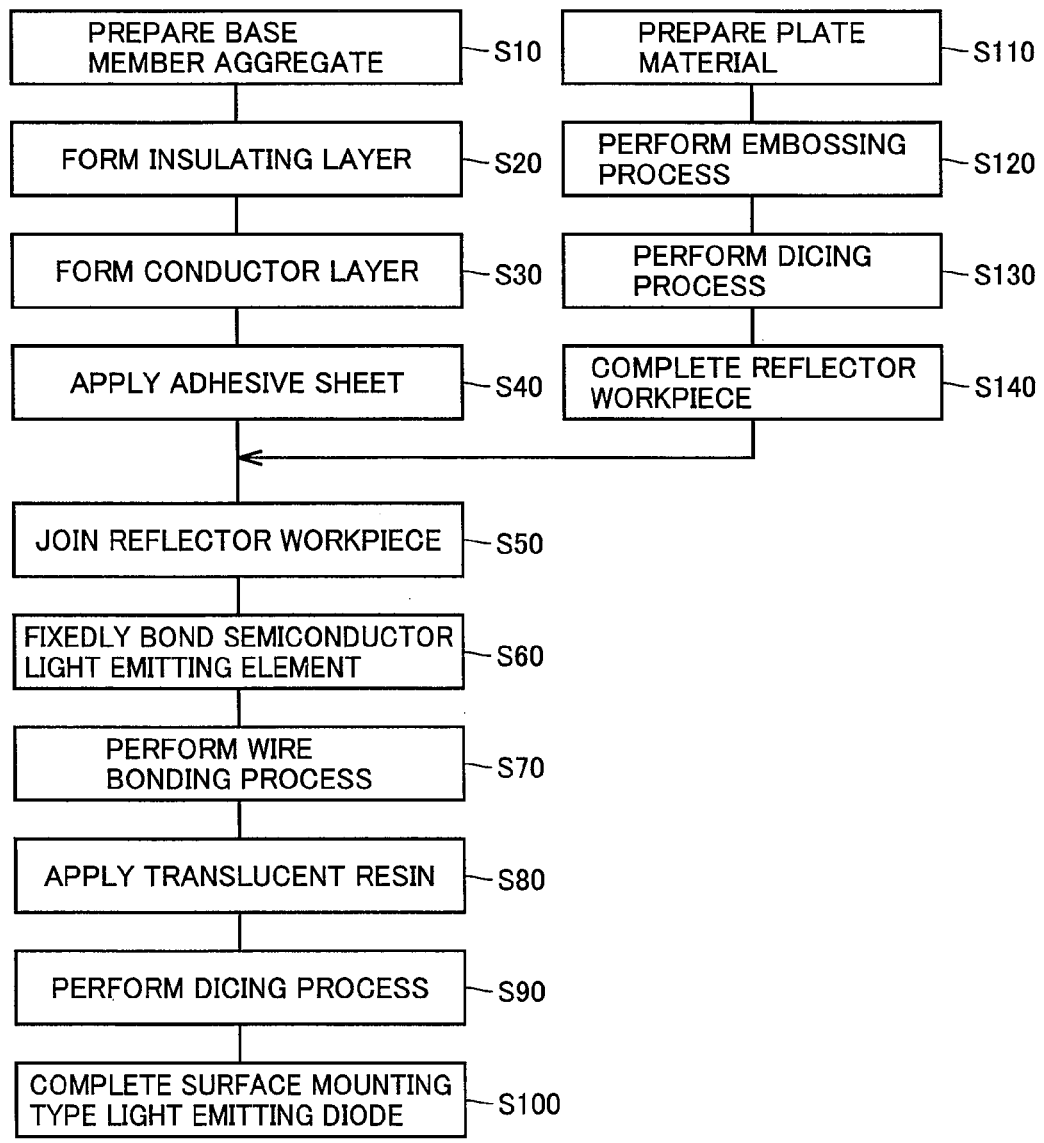
FIG. 3 is a flowchart showing a procedure of manufacturing the surface mounting type light emitting diode according to the first embodiment.

Next, description will be given of a procedure of manufacturing surface mounting type light emitting diode 10 shown in FIG. 1. As shown in FIG. 3, first, in step S10, an aluminum plate (a thickness: 0.5 mm) is prepared as a base member aggregate. In the base member aggregate, recesses are formed on a top face (a surface to which a semiconductor light emitting element is fixedly bonded in a subsequent process) and a bottom face opposite to the top face by a method for embossing the base member aggregate in a direction that the base member aggregate is pressed by an embossing mold from above. Herein, the base member aggregate indicates a workpiece from which a base member 2 is obtained by a dicing process (a cutting process). As will be described later, the base member aggregate is subjected to various processes such as fixed bonding, wire bonding and resin sealing for a semiconductor light emitting element 1, and then is cut and divided into respective base members 2.

Figure 4:
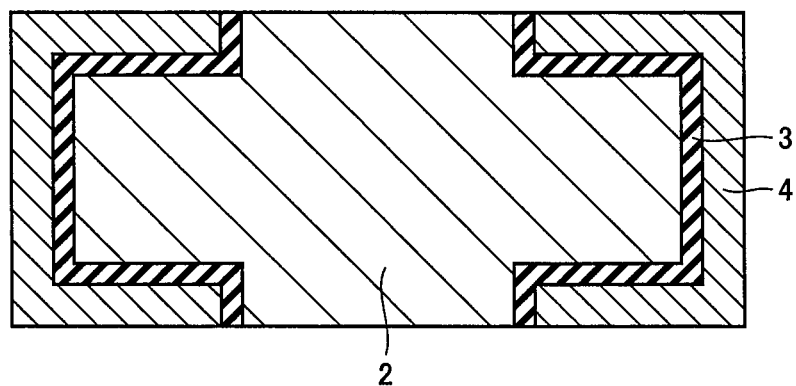
FIG. 4 schematically shows a step of forming a conductor layer.
Figure 5:
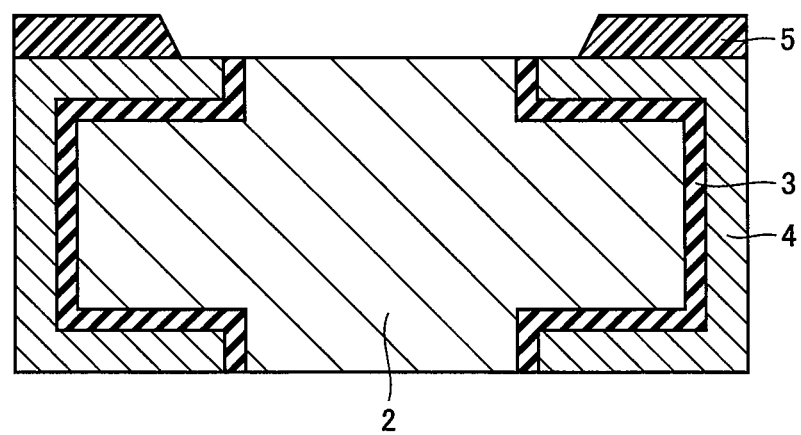
FIG. 5 schematically shows a step of applying an adhesive sheet.

As shown in FIG. 4, next, in step S20, a silicon dioxide layer (a thickness: 0.1 mm) is laminated as an insulating layer 3 on a side face of the plate-shaped base member aggregate and the recesses by a CVD (Chemical Vapor Deposition)

method. Subsequently, in step S30, a conductor layer 4 including a copper thin film (a thickness: 0.035 mm) formed as a metal wiring pattern conductor by an electroplating process and a sliver thin film (a thickness: 0.005 mm) formed by a silver plating process is laminated on a surface of insulating layer 3. A surface of conductor layer 4 is subjected to the silver plating process and, therefore, is coated with the silver thin film. Thus, conductor layer 4 is prevented from being altered. As shown in FIG. 5, next, in step S40, a heat conductive acryl sheet (a thickness: 0.05 mm) is applied as a heat conduction type adhesive sheet 5 onto conductor layer 4 at the top face side of the base member aggregate.

Figure 9A:
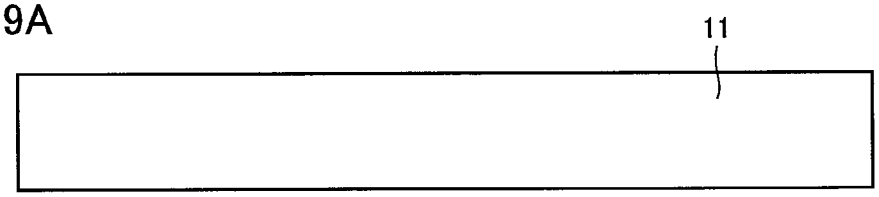
FIG. 9A is a side view of a plate material.
Figure 9B:
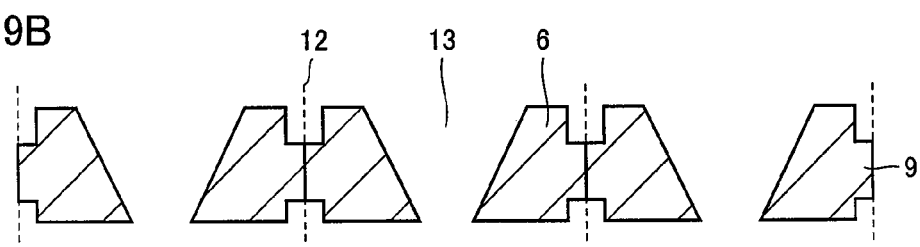
FIG. 9B is a sectional view of the plate material subjected to an embossing process.
Figure 9C:
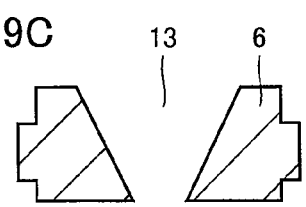
FIG. 9C is a sectional view of a reflector workpiece.

In steps S110 to S140, on the other hand, a reflector workpiece is formed. As shown in FIG. 9A, first, in step S110, an aluminum plate (a thickness: 1 mm) is prepared as a plate material 11. FIG. 9A shows a side face of plate material 11. In actual, a material to be prepared as plate material 11 is long in a direction perpendicular to a plane of FIG. 9A. Next, in step S120, a through hole 13 and a trench 12 for cutting are formed on the aluminum plate by a method for embossing both sides of the aluminum plate in a direction that the aluminum plate is pressed by an embossing mold from above. Herein, through hole 13 is formed so as to be a part of a conical face. As shown in FIG. 9B, in a cross section of the aluminum plate after the embossing process, through hole 13 has a diameter gradually tapered in a downward direction. Trench 12 for cutting corresponds to a region having a thickness smaller than that of plate material 11. Next, in step S130, the aluminum plate is diced along trench 12 for cutting. Thus, in step S140, the plate-shaped reflector workpiece is completed. The reflector workpiece is formed into a plate shape which is long in a direction perpendicular to a plane of FIG. 9C, and includes a plurality of members formed as reflectors 6 by a dicing process in the direction in a subsequent step.

Figure 6:
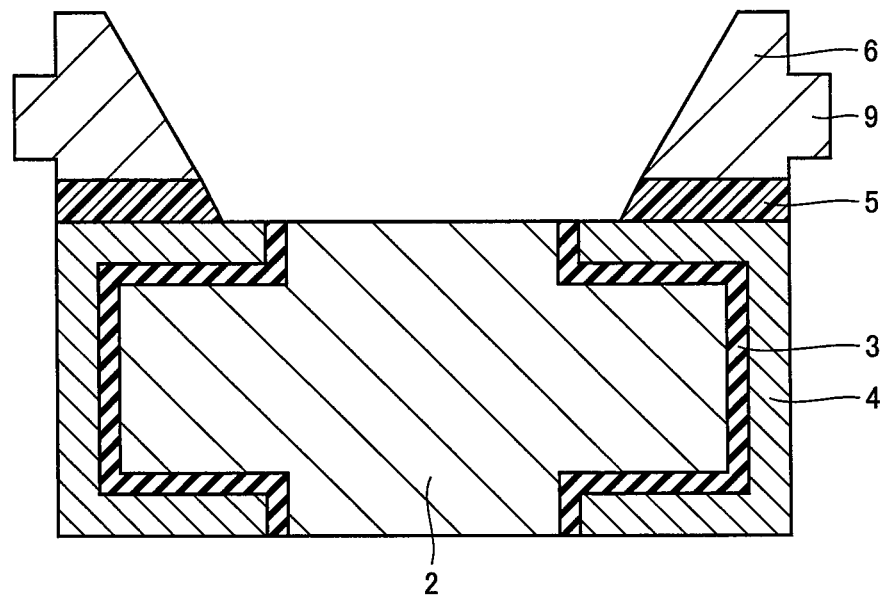
FIG. 6 schematically shows a step of joining a reflector workpiece.

As shown in FIG. 6, next, in step S50, the reflector workpiece is joined onto heat conduction type adhesive sheet 5. At this time, the reflector workpiece is formed into a plate shape which is long in a direction perpendicular to a plane of FIG. 6, and has a projection 9 which is a residue of a cutting margin divided along trench 12 for cutting by the dicing process in step S130.

Figure 7:
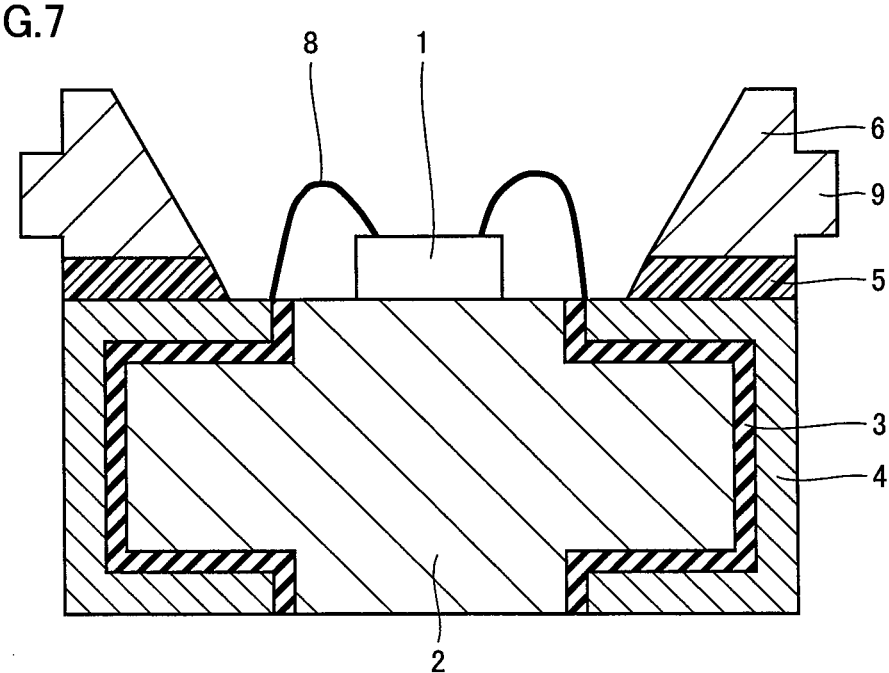
FIG. 7 schematically shows a step of fixedly bonding a semiconductor light emitting element.
Figure 8:
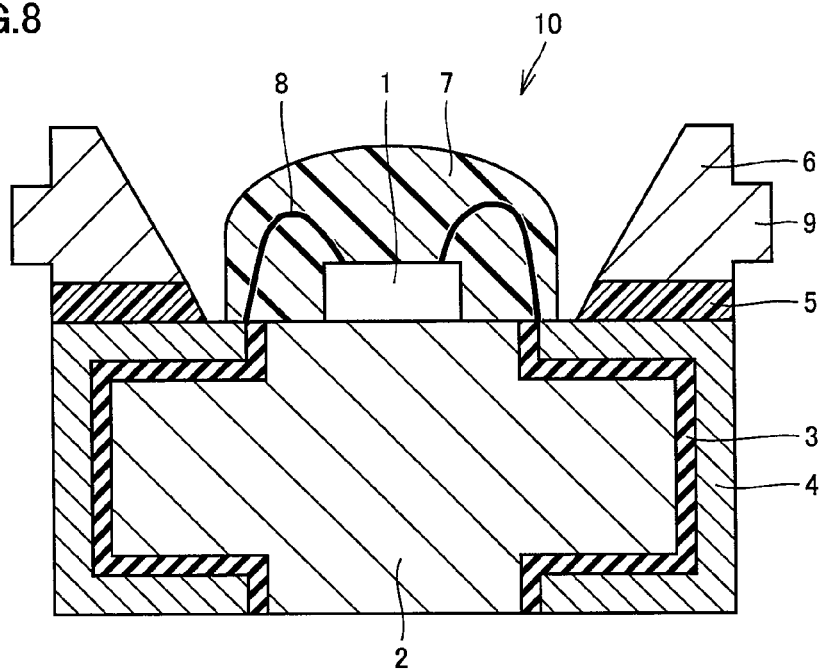
FIG. 8 schematically shows a step of applying a translucent resin.

As shown in FIG. 7, next, in step S60, semiconductor light emitting element 1 is fixedly bonded (mounted) onto the top face of base member 2 through a transparent epoxy resin. Semiconductor light emitting element 1 is fixedly bonded inside through hole 13 formed so as to be a part of the conical face of the reflector workpiece, so that the part of the conical face serves as an inner circumferential face of reflector 6. Thus, light emitted from semiconductor light emitting element 1 can be efficiently released to the outside. Subsequently, in step S70, an electrode of semiconductor light emitting element 1 is connected to a relevant bonding pad of conductor layer 4 through an electric conductive wire (a lead wire) 8 by a wire bonding process. As shown in FIG. 8, thereafter, in step S80, a translucent resin 7 (such as a silicone resin) containing a BOS-based yellow fluorescent material is applied inside reflector 6 with the use of a dispenser.

Next, in step S90, the reflector workpiece and the base member aggregate are diced along the trench for cutting formed on the reflector workpiece. In the reflector workpiece which is long in a direction perpendicular to a plane of FIG. 8, the trench for cutting is not shown in FIG. 8 because it is formed on a cross section different from that shown in FIG. 8. The trench for cutting is formed on the metallic reflector workpiece, and the metallic reflector workpiece is diced along the trench for cutting. Therefore, a cutting width in the reflector workpiece becomes narrow, so that the dicing process is performed readily. As a result, a possibility of failure in the dicing process is lowered, which improves productivity without reducing yield of surface mounting type light emitting diode 10. Thus, in step S100, a single surface mounting type light emitting diode 10 shown in FIG. 1 is manufactured, which has a single base member 2 and a single reflector 5.

In the first embodiment, semiconductor light emitting element 1 is formed into a chip shape having a P-electrode and an N-electrode provided on a single side. However, the present invention is not limited to this structure. Alternatively, semiconductor light emitting element 1 may be formed into a chip shape having P-electrodes and N-electrodes provided on both sides. It is assumed herein that the electrode of semiconductor light emitting element 1 is provided on a side opposite to a side where semiconductor light emitting element 1 comes into contact with base member 2. If the surface of base member 2, to which semiconductor light emitting element 1 is fixedly bonded, is subjected to surface treatment such as gold plating or silver plating 11, the bonding of semiconductor light emitting element 1 to base member 2 becomes favorable. In the case of silver plating, a light reflectivity increases and light release efficiency improves. Moreover, the substrate for semiconductor light emitting element 1 is made of an insulator. The material for semiconductor light emitting element 1 is not limited to the gallium nitride-based compound semiconductor. It is needless to say that semiconductor light emitting element 1 may be made of a ZnO (zinc oxide)-based compound semiconductor, an InGaAlP-based compound semiconductor or an AlGaAs-based compound semiconductor. In any cases, semiconductor light emitting element 1 can be mounted on base member 2.

Further, a plurality of semiconductor light emitting elements 1 can be mounted on base member 2. The mounting of the plurality of semiconductor light emitting elements 1 each emitting single-color light allows provision of a high power light source. It is needless to say that if semiconductor light emitting elements such as blue LED chips, green LED chips and red LED chips are mounted one by one or as many as each other, a light source to be obtained can perform toning of white light by adjustment of an amount of electric current to be fed to each LED chip.

Second Embodiment

Figure 10:
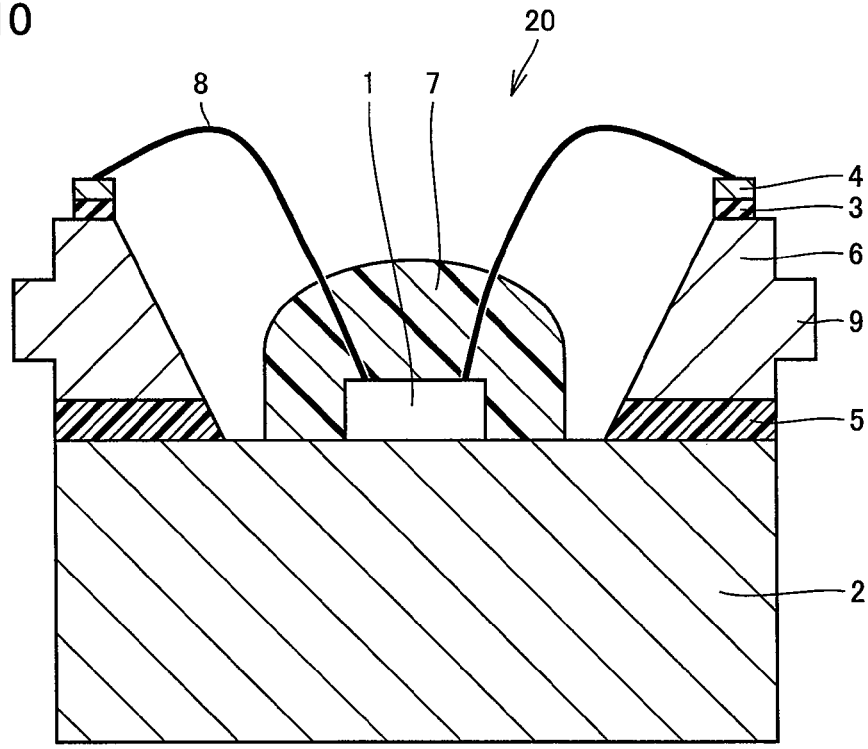
FIG. 10 schematically shows a part of a sectional structure of a surface mounting type light emitting diode according to a second embodiment of the present invention.
Figure 11:
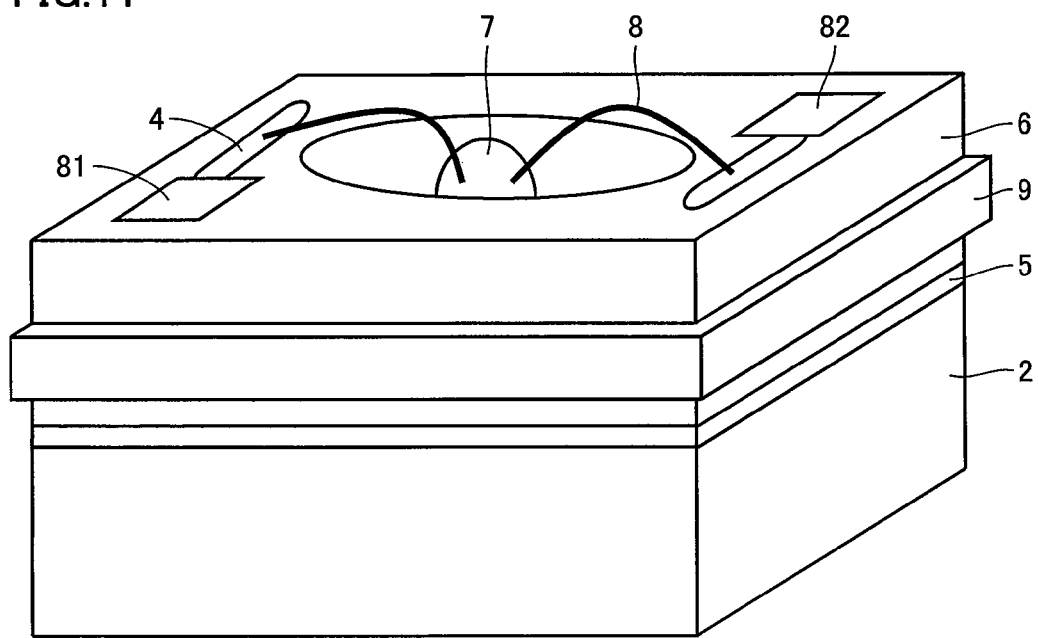
FIG. 11 is a perspective view of the surface mounting type light emitting diode shown in FIG. 10.

A surface mounting type light emitting diode 20 according to a second embodiment has a basically identical configuration to that of surface mounting type light emitting diode 10 according to the first embodiment. However, the second embodiment is different from the first embodiment in a point that an insulating layer 3 and a conductor layer 4 are configured as shown in FIG. 10.

Specifically, a reflector 6 forming surface mounting type light emitting diode 20 has an oval-shaped through hole (a longer diameter: 2 mm, a shorter diameter: 0.8 mm). Conductor layer 4 is laminated on a surface of reflector 6 with insulating layer 3 interposed therebetween, except a portion brought into contact with a base member 2 with a heat conduction type adhesive sheet 5 interposed therebetween. Conductor layer 4 is electrically connected to a semiconductor light emitting element 1 through an electric conductive wire 8. Thus, electric current for allowing semiconductor light emitting element 1 to emit light is fed to semiconductor light emitting element 1 from outside via external connection terminals 81 and 82 each connected to conductor layer 4. The remaining configurations of surface mounting type light emitting diode 20 are equal to those described in the first embodiment; therefore, repetitive description thereof will not be given here.

Figure 12:
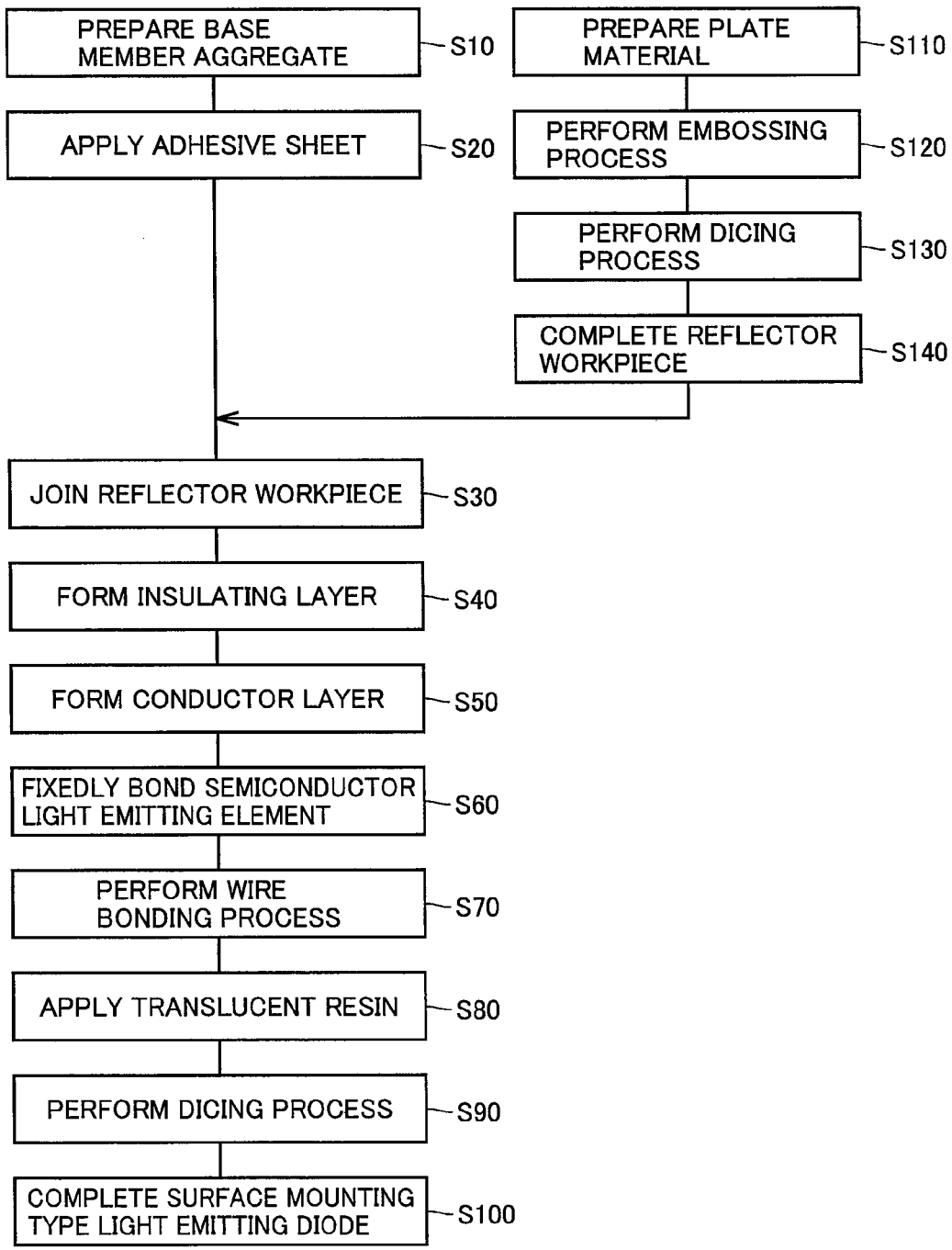
FIG. 12 is a flowchart showing a procedure of manufacturing the surface mounting type light emitting diode according to the second embodiment.

Next, description will be given of a procedure of manufacturing surface mounting type light emitting diode 20 shown in FIG. 10. As shown in FIG. 12, first, in step S10, an aluminum plate (a thickness: 0.5 mm) is prepared as a base member aggregate. Subsequently, in step S20, a heat conductive silicone sheet (a thickness: 0.05 mm) is applied as a heat conduction type adhesive sheet 5 onto the base member aggregate. On the other hand, in steps S110 to S140, a reflector workpiece is formed. Details of steps S110 to S140 are equal to those described in the first embodiment.

Next, in step S30, the reflector workpiece is joined onto heat conduction type adhesive sheet 5. Next, in step S40, a silicon dioxide layer (a thickness: 0.1 mm) is laminated as an insulating layer 3 on the reflector workpiece by a CVD (Chemical Vapor Deposition) method. Next, in step S50, a conductor layer 4 including a copper thin film (a thickness: 0.035 mm) formed as a metal wiring pattern conductor by an electroplating process and a silver thin film (a thickness: 0.005 mm) formed by a silver plating process is laminated on a surface of insulating layer 3. Details of step S60 and steps subsequent to step S60 are equal to those described in the first embodiment; therefore, repetitive description thereof will not be given here.

In the first and second embodiments, as one example, each of base member 2 and reflector 6 is made from a single aluminum plate material. Alternatively, each of base member 2 and reflector 6 may be made from a combination of various kinds of metal. For example, on a surface of a metal material, different metal is laminated by a plating process. The metal material for each of base member 2 and reflector 6 is not limited to Al. Alternatively, each of base member 2 and reflector 6 may be made of one of Cu, Fe, Mg and the like each of which is excellent in heat radiation performance and workability, or a complex thereof. More preferably, each of base member 2 and reflector 6 is made of a single material because of the following reason. As shown in FIG. 9, that is, each of base member 2 and reflector 6 can be readily fabricated and the productivity can be improved. In the case where each of base member 2 and reflector 6 is made of the single material, this single material may be not only one kind of metal, but also an alloy.

Figure 13:
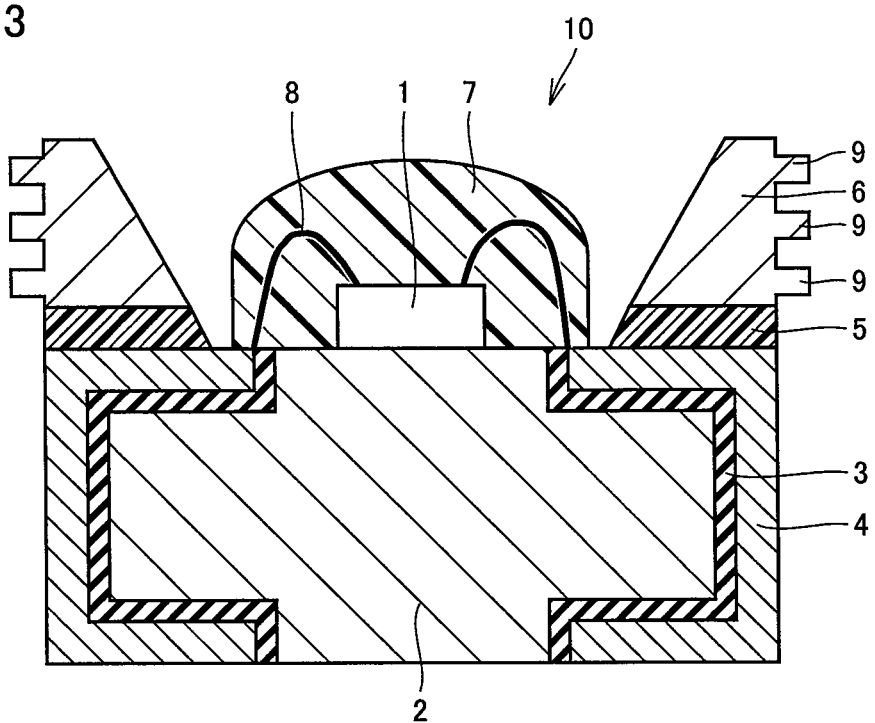
FIGS. 13 to 15 each schematically show a part of a sectional structure of a surface mounting type light emitting diode in which a shape of a reflector is modified.

As shown in FIG. 13, with regard to the shape of reflector 6, a portion other than the inner circumferential face serving as a light reflection face of reflector 6 is formed into an irregular shape, like projection 9. That is, reflector 6 may be formed into a shape like a heat radiation fin. Thus, radiation of heat from reflector 6 to the outside is further accelerated, so that the heat radiation performance of reflector 6 can be further improved. The shape of the light reflection face of reflector 6 is not limited to a conical shape. For example, reflector 6 may be formed such that the light reflection face is a part of a spherical face or a paraboloidal face. In this case, light emitted from semiconductor light emitting element 1 can be released efficiently.

The material for insulating layer 3 is not limited to silicon dioxide. For example, insulating layer 3 may have a configuration that an acryl rubber, an epoxy or a silicone is bonded to base member 2 and conductor layer 4 with a heat conduction type viscous material interposed therebetween.

Moreover, heat conduction type adhesive sheet 5 may come into contact with translucent resin 7. In surface mounting type light emitting diode 10 shown in FIG. 1, for example, heat conduction type adhesive sheet 5 is formed inside with respect to the inner circumferential face of reflector 6, except a region where semiconductor light emitting element 1 is wire-bonded to conductor layer 4. Thus, heat conduction type adhesive sheet 5 can be brought into contact with translucent resin 7. In this case, heat radiated to translucent resin 7 can be transferred to reflector 6 via heat conduction type adhesive sheet 5. Accordingly, heat generated from semiconductor light emitting element 1 can be efficiently radiated to the outside.

Figure 14:
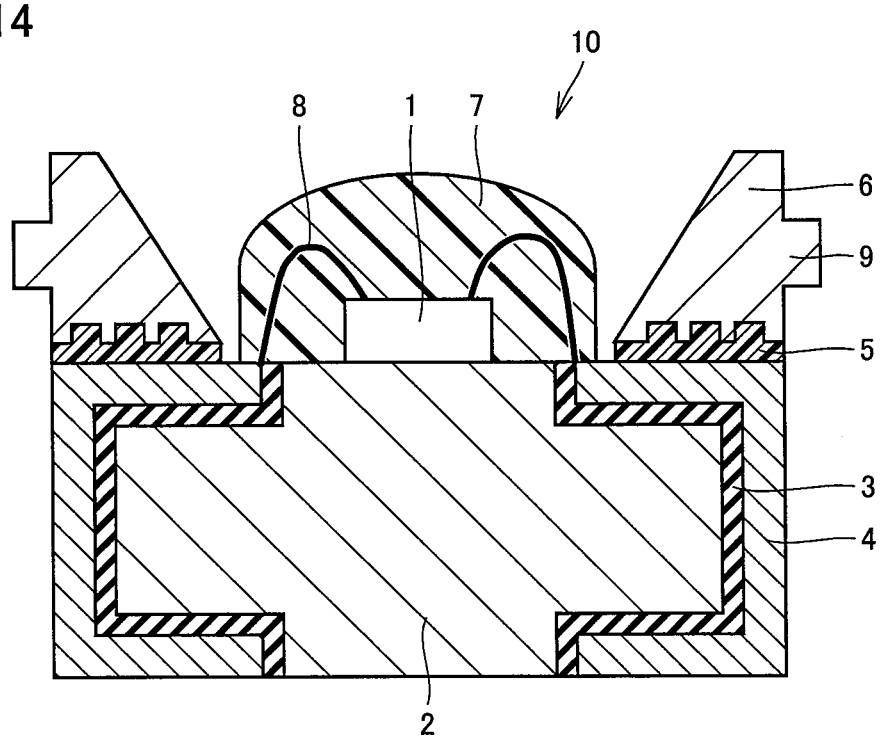
Figure 15:
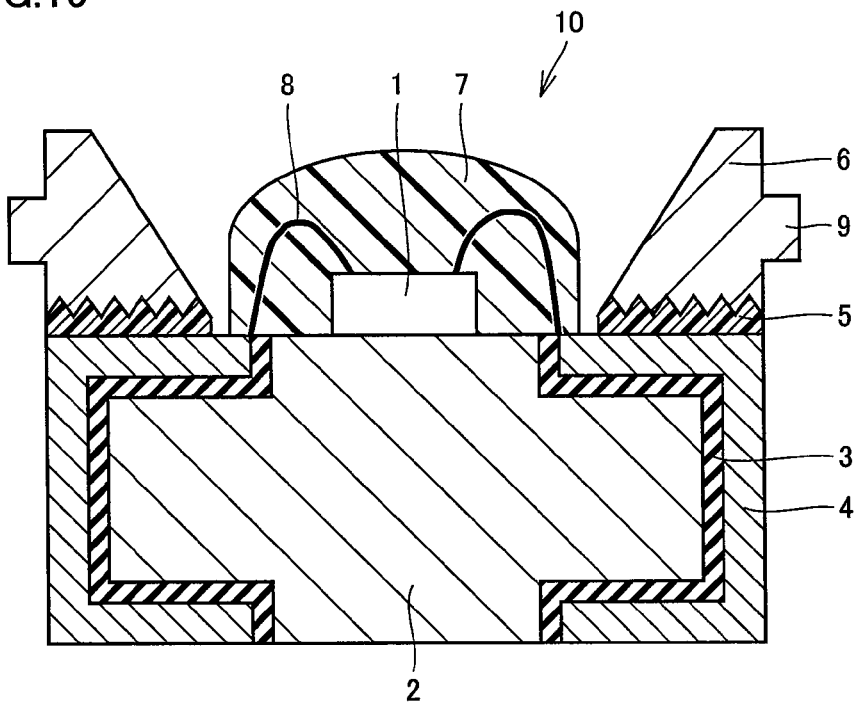
Figure 16:
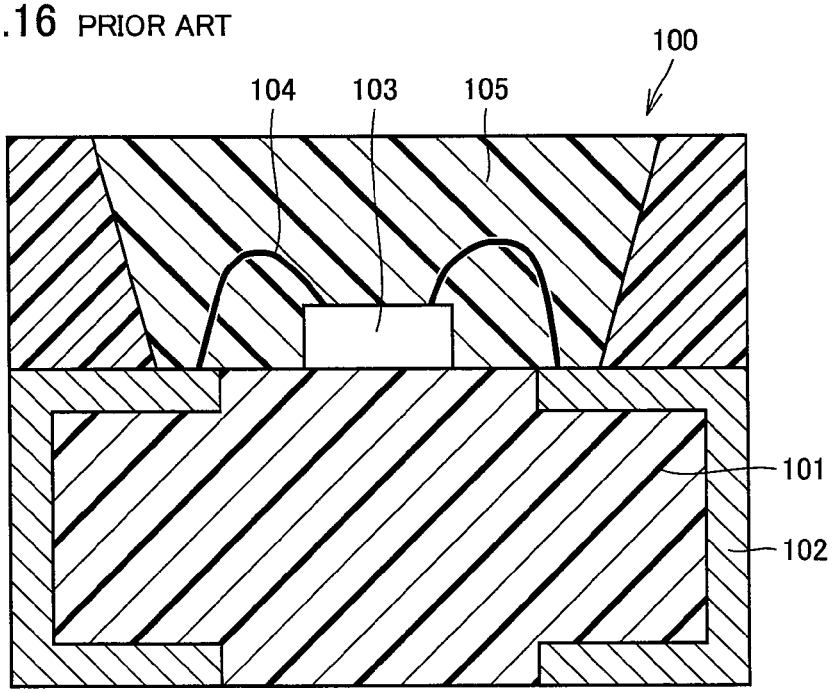
FIG. 16 is a schematic sectional view showing a configuration example of a conventional surface mounting type light emitting diode.

Further, reflector 6 may be formed into such a shape that a junction area between heat conduction type adhesive sheet 5 and reflector 6 increases. At a junction between reflector 6 and heat conduction type adhesive sheet 5, for example, reflector 6 may be formed into an irregular shape as shown in FIG. 14 or may be formed into a shape having sawtooth notches as shown in FIG. 15, which improves a heat conductivity from heat conduction type adhesive sheet 5 to reflector 6. Accordingly, the heat generated from semiconductor light emitting element 1 can be efficiently radiated to the outside. Further, a joining strength of reflector 6 can be enhanced.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A surface mounting type light emitting diode comprising:
    a base member comprising a metallic base member, an insulating portion, and a conducting portion, said insulating portion contacting a vertical surface of said metallic base member, said conducting portion contacting a vertical surface of said insulating portion, and said insulating portion electrically insulating said metallic base member from said conducting portion;
    a semiconductor light emitting element having a bottom face fixedly bonded to a top face of said metallic base member, the top face being a horizontal surface of said metallic base member; and
    a metallic reflector joined to the top face of said conducting portion with an insulating adhesive sheet interposed therebetween, so as to surround said semiconductor light emitting element,
    wherein the metallic base member comprises a center metallic portion and a protruding metallic portion protruding from a vertical surface of the center metallic portion, the semiconductor light emitting element is disposed on the center metallic portion, and a top face and a bottom face of the protruding metallic portion are covered by the insulating portion.

2. The surface mounting type light emitting diode according to claim 1, wherein said reflector has a projection formed at an outer peripheral face thereof, the projection having a width smaller than a width of said outer peripheral face.

3. The surface mounting type light emitting diode according to claim 2, wherein said reflector has a plurality of projections each equal to said projection.

4. The surface mounting type light emitting diode according to claim 1, wherein said metallic base member is made of one or more of Al, Cu, Fe and Mg, or a complex thereof.

5. The surface mounting type light emitting diode according to claim 1, wherein said reflector is made of one or more of Al, Cu, Fe and Mg, or a complex thereof.

6. The surface mounting type light emitting diode according to claim 1, further comprising:
    a plurality of semiconductor light emitting elements each equal to said semiconductor light emitting element.

7. The surface mounting type light emitting diode according to claim 1, wherein said adhesive sheet is made of one or more of a heat conductive silicone, a heat conductive acryl and a heat conductive epoxy, or a complex thereof.

8. The surface mounting type light emitting diode according to claim 1, wherein said reflector has an inner circumferential face formed into a part of a conical face, a spherical face or a paraboloidal face.

9. The surface mounting type light emitting diode according to claim 1, wherein at least the top face of said metallic base member, to which said semiconductor light emitting element is fixedly bonded, is subjected to gold plating or silver plating.

10. The surface mounting type light emitting diode according to claim 1, wherein the top face of said metallic base member is subjected to gold plating or silver plating to form a conductor layer electrically connected to said semiconductor light emitting element.

11. The surface mounting type light emitting diode according to claim 1, further comprising:
a translucent resin provided on said base member so as to cover said semiconductor light emitting element and to come into no contact with said reflector.

12. The surface mounting type light emitting diode according to claim 1, further comprising:
a translucent resin provided on said base member so as to cover said semiconductor light emitting element and to come into no contact with said reflector,
wherein said translucent resin contains a fluorescent material excited by light emitted from said semiconductor light emitting element to emit light longer in wavelength than said released light.

13. The surface mounting type light emitting diode according to claim 1, wherein said semiconductor light emitting element is a blue semiconductor light emitting element made of a gallium nitride-based compound semiconductor, the surface mounting type light emitting diode further comprising:
a translucent resin provided on said base member so as to cover said blue semiconductor light emitting element and to come into no contact with said reflector,
wherein said translucent resin contains a fluorescent material excited by light released from said blue semiconductor light emitting element to emit yellow light.

14. The surface mounting type light emitting diode according to claim 1, wherein said reflector has an irregular bonding face to said base member.

15. The surface mounting type light emitting diode according to claim 1, wherein said reflector has a sawtoothed bonding face to said base member.

16. The surface mounting type light emitting diode according to claim 1, wherein two electrodes are disposed on a top face of the semiconductor light emitting element, and the conducting portion is connected to one of the two electrodes, and the metallic base member is not connected to any of the two electrodes.

* * * * *